United States Patent [19]
Hattori et al.

[11] Patent Number: 5,361,121
[45] Date of Patent: Nov. 1, 1994

[54] PERIPHERY EXPOSING METHOD AND APPARATUS THEREFOR

[75] Inventors: Ken Hattori; Kesayoshi Amano, both of Tokyo; Masao Nakajima, Kawasaki; Masayoshi Naito, Sendai, all of Japan

[73] Assignee: Nikon Corporation, Tokyo, Japan

[21] Appl. No.: 694,759

[22] Filed: May 2, 1991

[30] Foreign Application Priority Data

May 16, 1990 [JP] Japan ............... 2-126447

[51] Int. Cl.⁵ .............. G03B 27/42; G03B 27/48; G03B 27/50
[52] U.S. Cl. .............. 355/50; 355/53; 355/68
[58] Field of Search ........... 430/22, 30, 311, 327, 430/397; 355/77, 50, 53, 68

[56] References Cited

U.S. PATENT DOCUMENTS

| | | | |
|---|---|---|---|
| 4,899,195 | 2/1990 | Gotoh | 355/77 |
| 4,910,549 | 3/1990 | Sugita | 355/53 |
| 5,028,955 | 7/1991 | Hayashida | 355/53 |
| 5,229,811 | 7/1993 | Hattori | 355/50 |

FOREIGN PATENT DOCUMENTS

| | | |
|---|---|---|
| 58-92221 | 6/1983 | Japan . |
| 60-60724 | 8/1985 | Japan . |
| 256924 | 2/1990 | Japan . |

*Primary Examiner*—Marion E. McCamish
*Assistant Examiner*—Kathleen Duda
*Attorney, Agent, or Firm*—Shapiro and Shapiro

[57] ABSTRACT

Prior to a periphery exposing operation, a light emitting unit and a light receiving unit are retracted to a position separate from a wafer, and a calibrating operation is conducted in the retracted position utilizing a light shield plate different from the wafer to be exposed, thereby obtaining a servo control reference signal for the exposure. At the exposure of the periphery portion of the wafer, the exposure width is controlled according to the reference signal. It is therefore rendered possible to achieve exact peripheral exposure, including the intensity and intensity distribution of the exposing light beam immediately before the irradiation of the peripheral portion of the wafer.

4 Claims, 7 Drawing Sheets

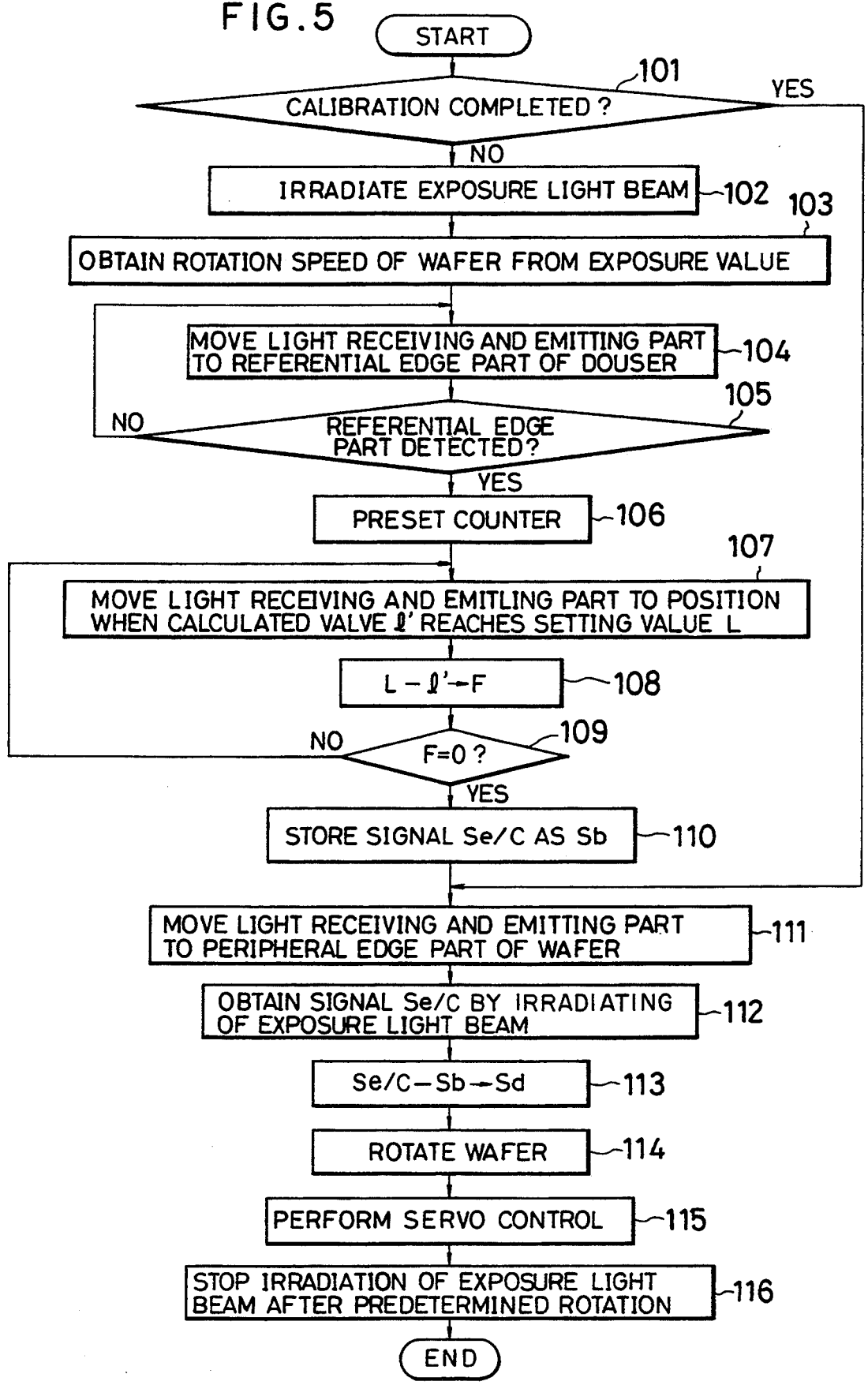

PERIPHERY EXPOSING METHOD AND APPARATUS THEREFOR

BACKGROUND OF THE INVENTION

1. Field of the Invention

The present invention relates to a method for selectively exposing a peripheral portion of a substrate such as a wafer for integrated circuit manufacture, and an apparatus therefor.

2. Related Background Art

It is already known that photoresist, coated on a substrate such as a wafer for forming fine circuit patterns thereon, tends to be peeled off in the peripheral portion of the wafer, and thus peeled photoresist induces detrimental effects on the subsequent integrated circuit manufacturing process. For preventing such photoresist peeling in the peripheral portion of wafer, there is already known an apparatus disclosed in the Japanese Laid-open Patent Hei 2-56924 (corresponding to the U.S. patent application Ser. No. 396,557 filed Aug. 21, 1989). This conventional apparatus is provided with a light-emitting unit for emitting an exposing light beam and a light receiving unit for receiving said light beam, wherein said units are positioned mutually opposite the peripheral portion of the wafer and rendered integrally movable in the radial direction of the wafer. Within said light beam, a predetermined width (length in the radial direction of the wafer) is intercepted by the wafer, and the remaining light beam is received by the light receiving unit positioned opposite to the light emitting unit across the peripheral portion of the wafer, and the signal obtained in said light receiving unit is used for servo operation for maintaining a constant exposure width on the wafer. In such apparatus, therefore, if the intensity of the exposing light received by the light receiving unit for a given exposure width becomes significantly different from an anticipated level, for example because of a lowered intensity of the exposing light resulting from deterioration of the light source, or because of replacement of the light source, the correlation with the target value of the servo operation becomes unclear, so that the exposure width in the periphery exposing operation becomes unstable.

Also if the intensity of the exposing beam is not uniform in the radial direction but has, for example, a Gaussian distribution as shown in FIG. 6A, the signal from the light receiving unit is not linearly related with the exposure width as shown in FIG. 6B, so that it becomes difficult to control the exposure width solely by the light reception signal obtained at the exposure of the peripheral portion of the wafer.

SUMMARY OF THE INVENTION

A first object of the present invention is to provide a periphery exposing method capable of exposing the peripheral portion of a substrate such as a wafer with a substantially uniform width, without being affected by the change in the intensity of exposing light beam or by the unevenness in the intensity distribution. A second object of the present invention is to provide an exposing apparatus for executing the above-mentioned method.

According to the present invention, prior to the periphery exposing operation, the light emitting unit and the light receiving unit are retracted to a position separate from the wafer, and a calibrating operation is conducted in said retracted position, utilizing a light shield plate different from the wafer to be exposed, thereby obtaining a servo control reference signal (target value) at the exposure. At the exposure of the periphery portion of the wafer, the exposure width is controlled according to said reference signal. It is therefore rendered possible to achieve exact peripheral exposure, including the intensity and intensity distribution of the exposing light beam immediately before the irradiation of the peripheral portion of the wafer.

It is also possible to expose the photoresist which may be deposited on the rear face of the wafer, by positioning a beam splitter in the exposing light beam for guiding said beam to said rear face of the wafer.

BRIEF DESCRIPTION OF THE DRAWINGS

FIG. 5 is a flow chart showing the function of the periphery exposing apparatus embodying the present invention;

DESCRIPTION OF THE PREFERRED EMBODIMENTS

Figure 1:
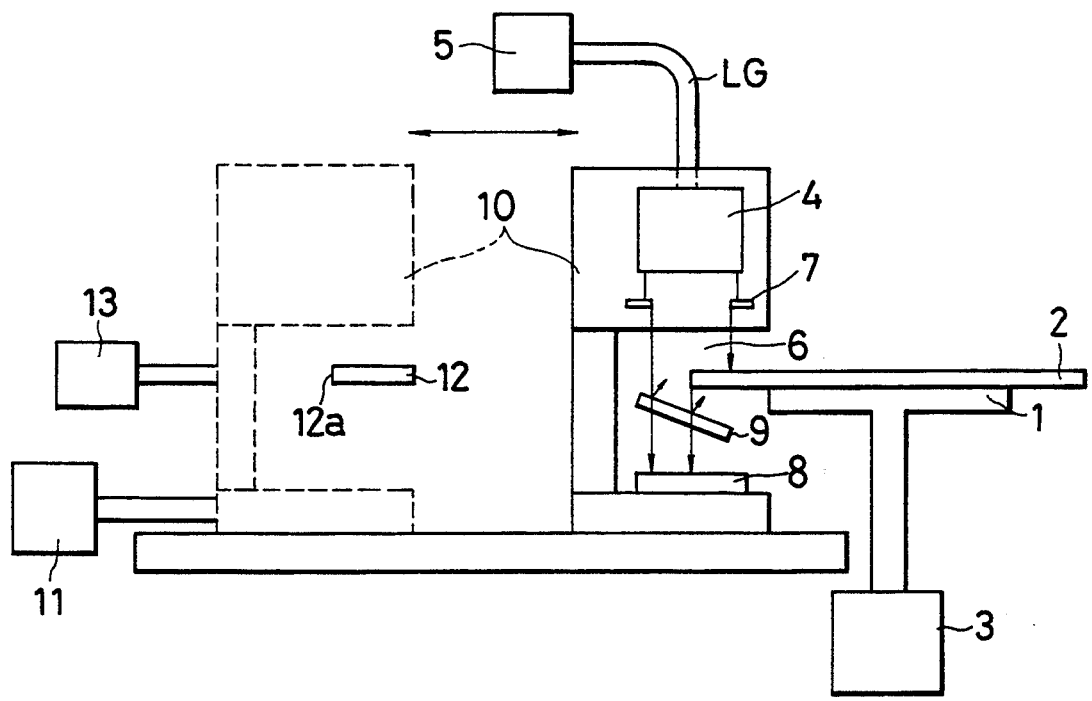
FIG. 1 is a schematic view of a periphery exposure apparatus embodying the present invention.

FIG. 1 is a schematic view of a periphery exposing apparatus embodying the present invention. A wafer 2, transported along an unillustrated wafer transport path, is supported by suction on a turntable 1, at a position where the center of the wafer substantially coincides with that of the turntable (said centers need not coincide exactly but may be mutually offset within a certain distance). Said turntable 1, supporting the wafer 2 thereon, is rotated at a predetermined speed by a motor 3. An irradiating unit 4, positioned above the peripheral portion of the wafer 2, is given exposing light from a light source 5 through a light guide LG. The light source 5 need not be positioned close to the irradiating unit 4 but may be positioned in any conveniently available space. The irradiating unit 4 is provided with a diaphragm 7, for limiting the exposing light beam 6, actinic to the photoresist on the wafer 2, to a predetermined shape. A light receiving unit 8, composed of a position sensor or a silicon photodiode, is positioned opposite to the irradiating unit 4, across the peripheral portion of the wafer 2, and is adapted to receive, through an inclined beam splitter 9, a part of the exposing light beam 6 of which the remaining part is intercepted by the peripheral edge portion of the wafer 2 or a light shield plate to be explained later. The edge 12 of the wafer 2 or of the light shield plate 12 (reference edge 12a) is detected, based on a photoelectric signal from said light receiving unit 8. Between the light receiving unit 8 and the wafer 2, there is provided the beam splitter 9 for transmitting a part and reflecting the remaining part, of the light of the beam 6 which is not intercepted by the wafer 2 or light shield plate 12 and which is directed toward the light receiving unit 8. Said beam splitter 9 reflects a part of the exposing light beam toward the rear face of the peripheral portion of the wafer 2, thereby exposing the photoresist deposited on said rear face. The irradiating unit 4 and the light receiving unit 8 are integrally fixed on a driving unit 10, which is rendered movable in the radial direction of the wafer 2 (radially from the center of rotation of the turntable 1) by a motor 11, for example through a feed screw. The light shield plate 12 is fixed at substantially the same height as the wafer 2 and within the movable range of the driving unit 10, in order to intercept a part of the exposing light beam 6 from the irradiating unit 4 when said unit 4 and the light receiving unit 8 are moved to a position separate from the wafer 2. The light shield plate 12 is provided with a reference edge 12a, for patially intercepting the exposing light beam 6, substantially parallel to the edge of the wafer 2. For detecting the position of the driving unit 10, there is provided a position detector 13, composed for example of an encoder, a position scale or an interferometer. The measuring range of said position detector 13 may cover the entire moving stroke of the driving unit 10, or may cover a range in the vicinity of the position where the exposing light beam irradiates the light shield plate 12.

Figure 2:
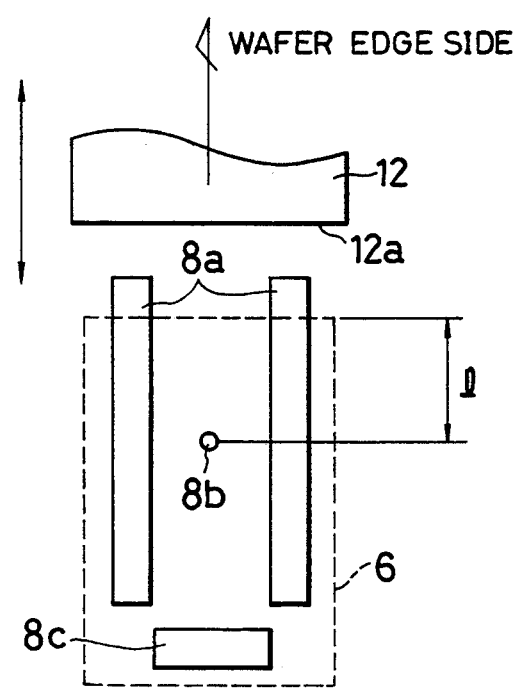
FIG. 2 is a view of a light receiving unit of a periphery exposure apparatus of the present invention.

Now reference is made to FIG. 2, for explaining the structure of the light receiving unit 8 and its positional relationship to the exposing light beam 6 and the light shield plate 12. The light receiving unit 8 is composed of a photosensor 8a having light receiving faces extended in the moving direction of the driving unit 10, a pinhole-shaped edge sensor 8b, and a photosensor 8c positioned farthest from the light shield plate 12. The photosensor 8a generates a photoelectric signal Se of a level corresponding to the amount of light reaching the light receiving unit 8 without being intercepted by the light shield plate 12 or the wafer 2, while the photosensor 8c generates a photoelectric signal C of a level constantly corresponding to the intensity of the exposing light beam 6. The edge sensor 8b generates a photoelectric signal B which assumes a high level when the edge 12a is positioned within a distance l from the front (wafer) side end of the exposing light beam, but becomes substantially zero when said edge is outside said distance l, thereby detecting the position of the reference edge 12a of the plate 12 or the edge of the wafer 2. The light receiving unit 8 receives the exposing light beam 6 with a fixed relative relationship, as illustrated. Thus the front end of the exposing light beam 6 and the edge sensor 8b have a predetermined distance l, so that an exposure width l is obtained on the light shield plate 12 or on the wafer 2 when said light shield plate 12 or wafer 2 intrudes into the exposing light beam to a point that it intercepts the light entering the edge sensor 8b. In order to adjust the exposure width to an arbitrary value L, the driving unit 10 is moved by an amount corresponding to L-l from a reference position for the exposure width l, according to the position detection by position detector 13. Then the exposing light beam 6 is emitted to thus obtain said arbitrary exposure width L on the light shield plate 12, and the signal Se obtained from the light receiving unit 8 in this state is stored as a servo reference signal Sb in a periphery exposure control unit 14. The above-explained structure is required in a calibrating operation to be explained later.

Figure 3:
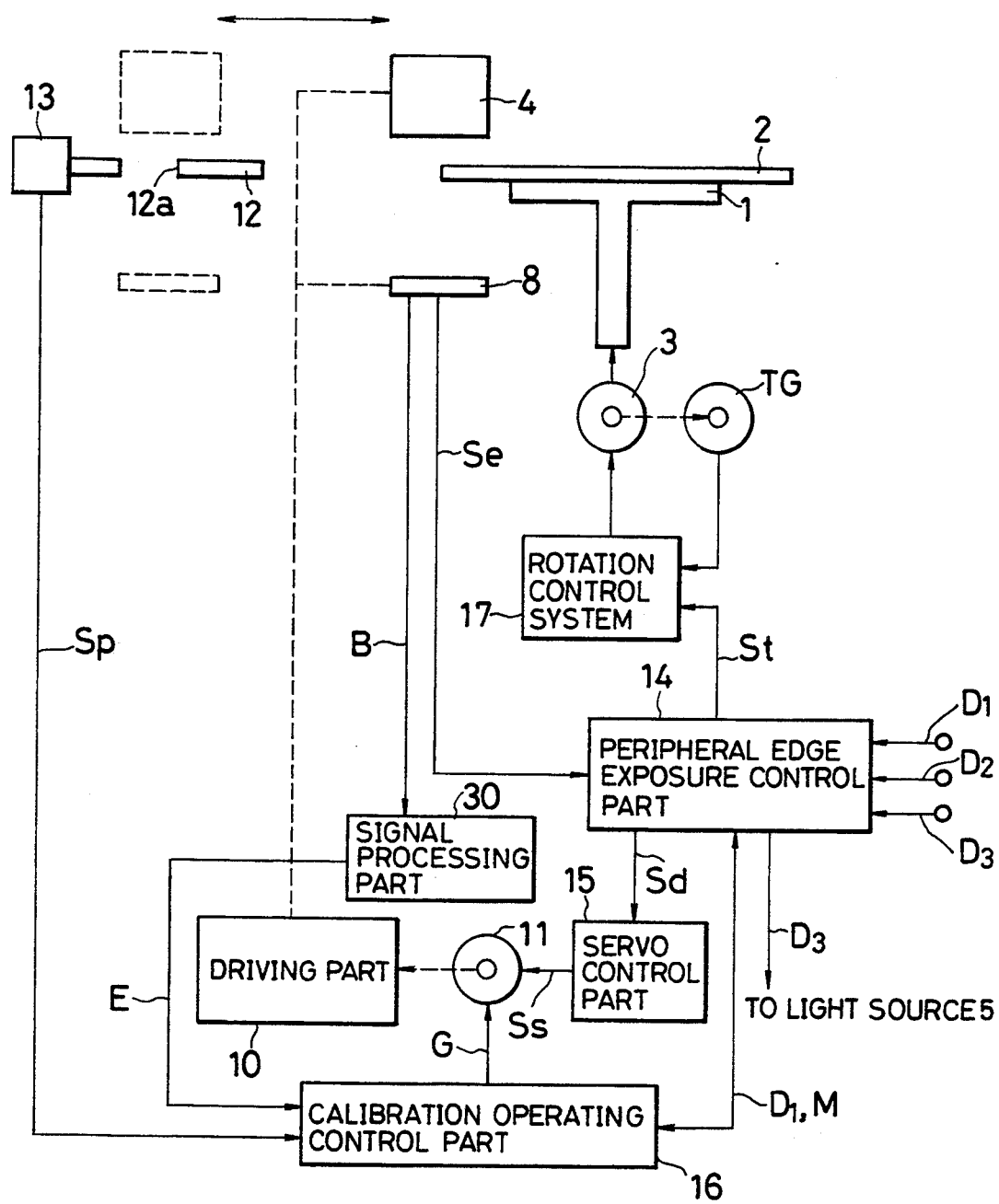
FIGS. 3 and 4 are block diagrams of a control system of a periphery exposing apparatus embodying the present invention.

FIG. 3 is a block diagram of the entire control system of the periphery exposure apparatus embodying the present invention. The light receiving unit 8 receives the exposing light beam 6, coming from the irradiating unit 4 and not intercepted by the light shield plate 12 or wafer 2, and sends a detection signal Se, of a level corresponding to the amount of received light, to the periphery exposure control unit 14. The light receiving unit 8 also sends a photoelectric signal B to a signal processing unit 30, upon detecting the reference edge 12a of the shield plate 12 or the edge of the wafer 2. In response to said photoelectric signal B, the signal processing unit 30 sends an edge detection signal E to a calibrating operation control unit 16. Said unit 16, receiving said edge detection signal E, a position signal Sp (corresponding to an exposure width l' to be explained later) from the position detector 13 and data D1 from the periphery exposure control unit 14 relating to the necessary peripheral exposure area (set exposure width L), generates a rotation control signal G for a motor 11 and a memory control signal M for causing the periphery exposure control unit 14 to store the detection signal Se from the light receiving unit 8 as a reference signal. The periphery exposure control unit 14 receives the data D1 relating to the necessary peripheral exposure area (set exposure width L), data D2 relating to the appropriate exposure amount, data D3 on the on/off state of the light source 5 (or a shutter provided therein), the detection signal Se from the light receiving unit 8 and the memory control signal M for storing said detection signal Se as the servo reference signal (target value) Sb, the unit 14 also generates a speed signal St for a rotation control system 17, a deviation signal Sd for a servo control unit 15, data D1 for the calibrating operation control unit 16, and data D3 for the light source 5. The rotation control unit 17, for rotating the wafer, receives the speed signal St on the rotating speed from the periphery exposure control unit 14 and drives the motor 3, thereby rotating the turntable 1. A tachogenerator TG effects feedback of a signal, corresponding to the rotating speed of the motor 3 to the rotation control system 17, thereby achieving the rotation of the turntable 1 constantly at a controlled speed. The servo control unit 15 receives, from the periphery exposure control unit 14, a deviation signal Sd representing the difference between the target signal level memorized as the reference signal Sb and the signal level from the light receiving unit 8, and sends a servo drive signal Ss to the motor 11. Said motor 11 drives the drive unit 10 according to said servo drive signal Ss in the periphery exposure operation, or according to a control signal G from the calibrating operation control unit 16 in the calibrating operation. The drive unit 10 integrally moves the irradiating unit 4 and the light receiving unit 8 by means of the motor 11.

Figure 4:
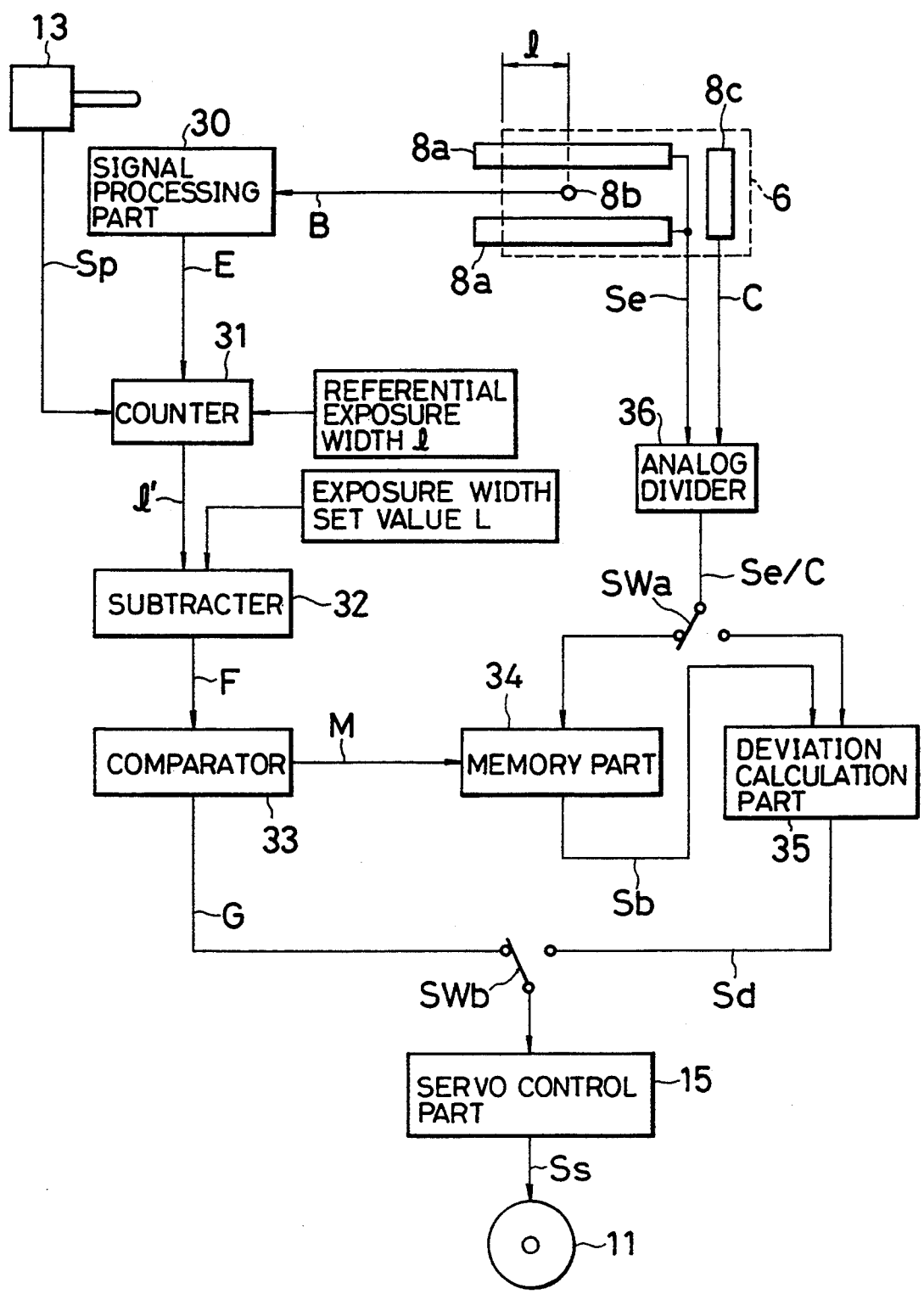
Figure 6A:
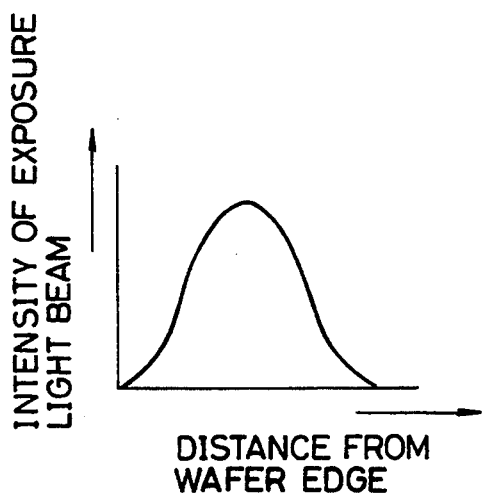
FIG. 6A is a chart showing the intensity distribution of the exposing light beam.
Figure 6B:
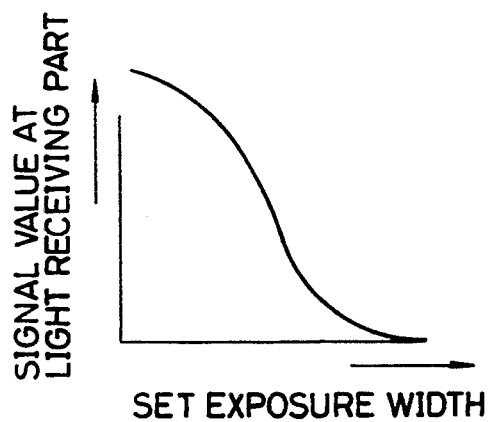
FIG. 6B is a chart showing the signal intensity from the light receiving unit.

In the following there will be given a further explanation on the periphery exposure control unit 14 and the calibrating operation control unit 16, with reference to FIG. 4. The signal processing unit 30 receives the photoelectric signal B detected by the edge sensor 8b, and provides a counter 31 with a binary edge detection signal E of which logic value is inverted when the reference edge 12a of the light shield plate 12 (or the wafer edge) crosses the edge sensor 8b. Said counter 31 is provided for counting the position signal pulses from the position detector 13. The counter 31 receives the detection signal E from the signal processing unit 30, and, when the logic level of said signal is inverted, presets the count at a value corresponding to the reference exposure width 1. The count 1' of said counter 31, indicating the actual exposure width is given, together with data L on the arbitrarily selected exposure width, to a subtractor 32, which sends the difference F of two data L, 1' to a comparator 33. Said comparator 33 discriminates whether said difference F is zero, and sends the memory control signal M to the memory unit 34 if said difference F is zero, or sends a rotation signal G to the motor 11 through a switch SWb so as to reduce the difference F if it is not zero. In the particular arrangement of FIG. 4, the memory unit 34 receives a signal Se/C, obtained by dividing the detection signal Se from the photosensor 8a of the light receiving unit 8 by the signal C from the photosensor 8c in an analog divider 36, and stores said signal Se/C upon receipt of the memory control signal M. During the periphery exposure of the wafer memory unit 34 sends thus stored signal Se/C as the servo reference signal Sb to a deviation calculating unit 35, which calculates the deviation signal Sd between said signal Sb and the signal Se/C being obtained from the light receiving unit 8 through the analog divider 36. The deviation calculating unit 35 a switch SWa and supplies said deviation signal Sd to the servo control unit 15. The switches SWa, SWb in FIG. 4 are shown in the calibrating state, and are shifted from the illustrated state in the periphery exposure operation on the wafer. The memory unit 34 and the calculating unit 35 in Fig. 4 correspond to the periphery exposure control unit 14 in FIG. 3, and the calibrating operation control unit 16 in FIG. 3 is composed of the signal processing unit 30, counter 31, subtractor 32 and comparator 33. Also the function of the periphery exposure control unit 14 and the calibrating operation control unit 16 in FIG. 3 may be performed by an appropriately programmed microcomputer.

In the following there will be explained the function of the periphery exposure apparatus of the present invention, with reference to FIG. 5. Prior to the actual exposure operation, a calibrating operation is conducted in order to obtain the servo reference signal for the periphery exposure. The periphery exposure control unit 14 discriminates whether the calibration for a pheriphery exposure has been completed (step 101). The calibration is conducted, for example, at every lot of continuously exposed wafers (25 wafers), or when a variation is detected by a sensor for detecting the variation in the light-emitting position of the light source 5. If the calibration is not completed, the exposing light beam 6 is emitted by the irradiating unit 4 (step 102). In this state an exposure start signal (light source on) of the data D3 is transmitted from the periphery exposure control unit 14 to the light source 5 (or a shutter therein), whereby said light beam 6 is received by the light receiving unit 8 without being intercepted by the light shield plate 12. Thus information St on the rotating speed of the wafer is determined from the amount of exposure received by the light receiving unit 8 (level of the signal Se/C) and the target exposure amount (step 103). Then the drive unit 10 is activated to move the irradiating unit 4 and the light receiving unit 8 to the reference edge 12a of the light shield plate or dowser 12 (step 104). When said reference 12a reaches the edge sensor 8b of the light receiving unit 8 whereby the signal processing unit 30 releases the edge detection signal E (step 105), the counter 31 is preset at a count corresponding to the reference exposure width 1 (step 106). In case the set exposure width L for peripheral exposure is different from the reference value 1, the irradiating unit 4 and the light receiving unit 8 are further moved until the count 1' of the counter 31 coincides with the set exposure width L (step 107). At the same time the substractor 32 calculates the difference F by subtracting the count 1' of the counter 31 from the set exposure width L (step 108), and the comparator 33 discriminates whether said difference F has reached zero (step 109). If F=0, the motor 11 is deactivated, and the memory control signal M is supplied to the memory unit, but, if F≠0, the irradiating unit 4 and the light receiving unit 8 are further moved until F+0 is reached (steps 107-109). In response to the memory control signal M, the memory unit 34 stores as the servo reference signal Sb the signal Se/C, which is obtained by normalizing the signal Se from the photosensor 8a, of the light receiving unit 8 with the intensity (signal C) of the exposing light beam 6, (step 110). The calibrating operation is thus completed.

Figure 7:
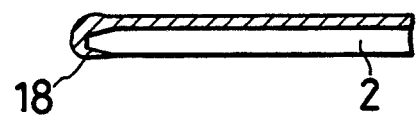
FIG. 7 is a cross-sectional view of a wafer coated with photoresist.

Subsequently the wafer periphery exposure is conducted, based on the above-explained calibration. At first the drive unit 10 integrally moves the irradiating unit 4 and the light receiving unit 8 to the peripheral part of the wafer 2, based on the approximate distance between the reference edge 12a of the light shield plate 12 and the designed periphery of the wafer 2 stored in advance in the servo control unit 15, under position detection by the position detector 13 or another (unillustrated) position detector (step 111). Then the exposing light beam 6 is emitted as in the step 102, and the signal Se/C obtained from the light receiving unit 8 is supplied to the deviation calculating unit 35 in the periphery exposure control unit 14 (step 112). The deviation calculating unit 35 compares said signal Se/C with the pre-stored servo reference signal Sb to determine the deviation signal Sd (step 113), for supply to the servo control unit 15. On the other hand, the rotation control system 17 controls the rotating speed of the motor 3 based on the predetermined speed information St, thereby rotating the turntable at a predetermined speed (step 114). The motor 3 is linked with the tachogenerator TG which feeds the rotation speed back to the rotation control system 17, whereby the turntable 1 can be constantly rotated at a constant speed. The servo control system 15 effects servo control on the drive unit 10 for the irradiating unit 4 and the light receiving unit 8, by sending a servo signal Ss to the motor 11 through the switch SWb in such a manner that the deviation signal Sd from the periphery exposure control unit 14 becomes zero, that is, such the exposing light beam 6 maintains a constant positional relationship relative to the edge of the wafer 2 (step 115). Thus the peripheral area of the wafer 2 is exposed uniformly with a constant radial width from the edge. At the same time the photoresist present on the rear face of the wafer as shown at 18 in FIG. 7 is exposed to the light beam reflected by the beam splitter 9 from the exposing light beam 6. After a predetermined amount of rotation of the wafer, a light source off signal D3 is supplied to the periphery exposure control unit 14, thereby terminating the peripheral exposure on a wafer (step 116).

Figure 8:
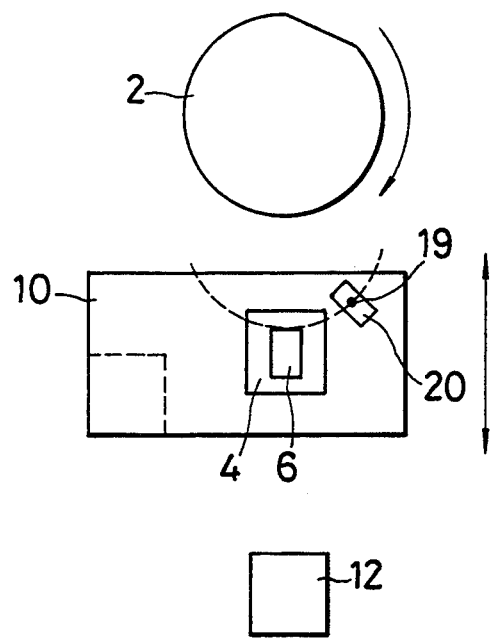
FIG. 8 is a view showing another method of edge detection in the periphery exposing apparatus of the present invention.

In the above-explained embodiment, the irradiating unit 4 is activated to emit the exposing light beam prior to the calibrating operation and the periphery exposing operation, but the exposing light beam 6 may be emitted also during the movement of the irradiating unit 4 and light receiving unit 8. If the servo control unit 15 does not have the information on the distance between the reference edge 12a of the light shield plate 12 and the designed periphery of the wafer 2, the irradiating unit 4 and the light receiving unit 8 are integrally moved toward the periphery of the wafer 2, with the emission of the exposing light beam 6 from the irradiating unit 4. In this case, the periphery exposure control unit 14 detects the wafer edge, based on the intensity change of the detection signal Se, and then servo controls the drive unit 10 by rotating the motor 11 through the servo control unit 15, based on the deviation signal Sd from the periphery exposure control unit 14 as in the foregoing embodiment. In the above-explained embodiment, the edge detection for the wafer 2 or the light shield plate 12 is conducted with the exposing light beam 6, but there may be provided a separate device for such edge detection. For example, as shown in FIG. 8, there may be provided an edge detector consisting of an irradiating unit 20 emitting a non-exposing light beam 19 and an unillustrated light receiving unit for receiving said light beam, both positioned close to the irradiating unit 4 and the light receiving unit 8, and a position where at least a part of said non-exposing light beam is intercepted by the wafer 2 is correlated with the position where the exposing light beam is intercepted by the wafer 2. In this case the exposing light beam 6 and the non-exposing light beam 19 are mutually displaced by a certain angle in the circumferential direction, so that the correlation therebetween becomes obscure when the orientation flat of the wafer is detected in the rotation thereof. For this reason, a servo response delay (or a simple delay) is provided between said light beams according to the time required for the wafer 2 to pass through said light beams, and in this manner the edge detection may be conducted without any difficulty at a position different from that of the exposing light beam 6. In this case the non-exposing light beam 19 is so positioned, according to the rotating direction of the wafer, that it effects the edge detection preceding the exposing light beam 6.

The above-explained embodiment employs a circular substrate such as wafer, but there may be employed a rectangular or square substrate.

In the following there will be explained a variations of the moving mechanism of the drive unit 10.

Figure 9:
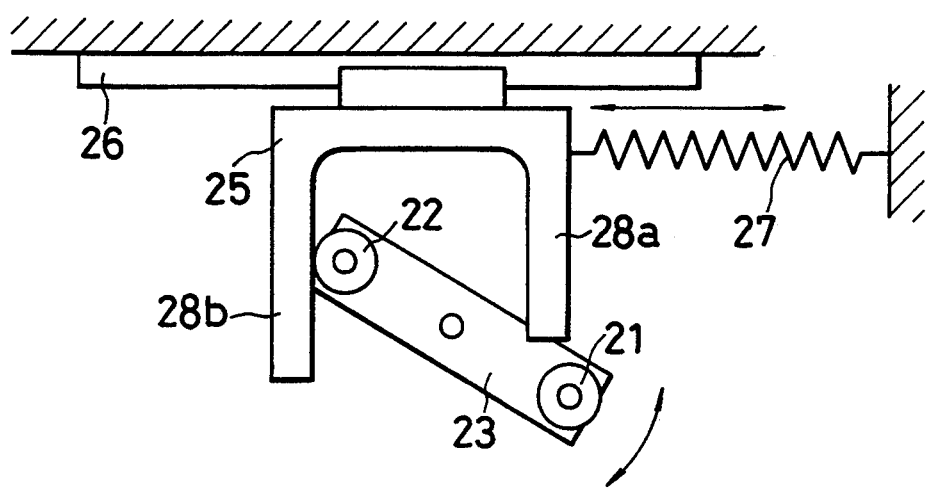
FIGS. 9 and 10 are schematic views showing variations of a feed mechanism, adapted for use in the periphery exposure apparatus of the present invention.
Figure 10:
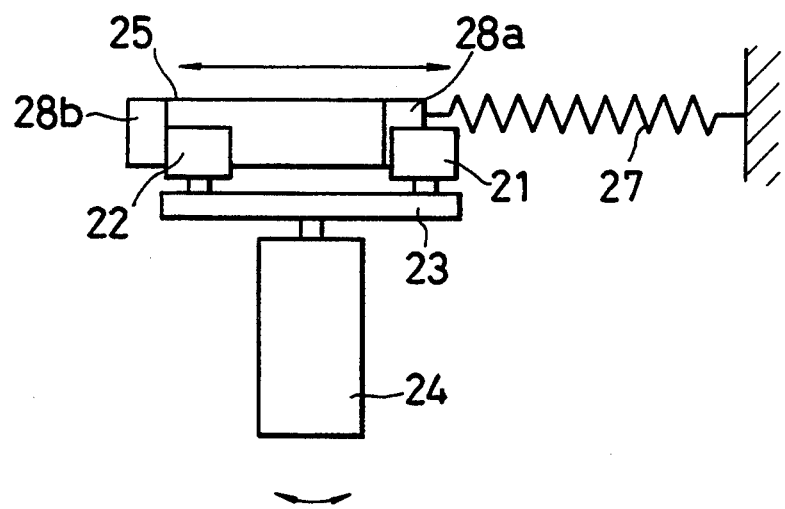

FIGS. 9 and 10 are respectively an elevation view and a plan view, schematically showing a variation of the moving mechanism of the drive unit 10 of the present embodiment, wherein rollers 21, 22 are mounted on both ends of a rotary arm 23, which rotates in reciprocation about the approximate center of the rollers 21, 22, by means of a motor 24. A movable block 25 is provided with at least two vertically depending contactors 28a, 28b at both ends in the moving direction of said block, and linearly moves along a linear guide 26, while being pressed to the roller 21 or 22 by a spring (a tension spring in this case) 27. Said movable block is linked directly or indirectly with the drive unit 10 explained above. Also the distance of the rotary centers of the rollers 21, 22 is selected substantially equal to that of the contact faces of the contactors 28a, 28b.

Figure 11A:
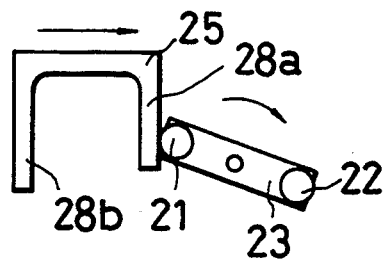
FIGS. 11A to 11E are views showing the function of a variation of the feed mechanism adapted for use in the periphery exposing apparatus of the present invention.
Figure 11B:
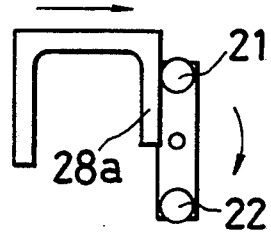
Figure 11C:
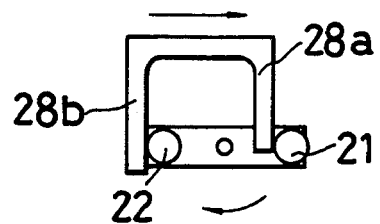
Figure 11D:
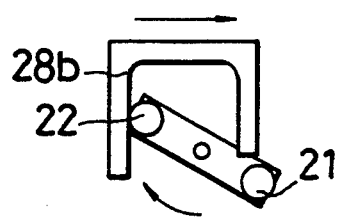
Figure 11E:
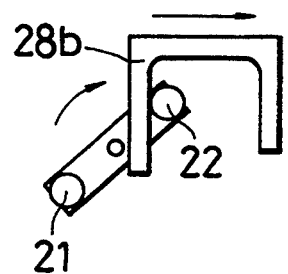

The function of this mechanism will be explained in the following, with reference to FIGS. 11A–11E. When the motor 24 is activated to rotate the arm clockwise in a state shown in FIG. 11A, the movable block 25 moves gradually to the right, with the contractor 28a maintained in contact with the roller 21 by the spring force, to reach a state shown in FIG. 11B. After a clockwise rotation of the arm 23 by about 90° from said state, the roller 22 starts to contact the contactor 28b and the roller 21 starts to be separated from the contactor 28a, as shown in FIG. 11C. Further rotation of the arm 23 causes the continued linear movement of the movable block 25 to the right, with the contactor 28b maintained in contact with the roller 22 by the spring force, as shown in FIGS. 11D and 11E. The above-explained cam structure may be employed in the drive unit 10 to achieve a large moving amount within a relatively limited space.

In the above-explained embodiment, the irradiating unit and the light receiving unit are integrally moved by moving means, but it is also possible to move the wafer and the light shield member relative to the exposing light beam. It is furthermore possible to fix all the irradiating unit, light receiving unit, wafer and light shield plate and to employ a variable path structure in the optical system of the irradiating unit, whereby the exposing light beam alone moves between the wafer and the light shield plate. In such case, the irradiating unit and the light receiving unit may be integrally moved relative to the wafer or the light shield plate as in the above-explained embodiment, solely in the minute relative movement (servo control in the periphery exposure operation) between the light beam and the wafer or the light shield plate.

We claim:

1. A periphery exposure apparatus for exposing a peripheral part of a substrate coated thereon with photoresist, comprising:
    irradiating means for emitting a light beam actinic to the photoresist on said substrate;
    light receiving means so positioned as to receive said light beam;
    a light shield member having a reference edge corresponding to a periphery of said substrate;
    switch means for switching a relative positional relationship of said light beam, said light shield member and said substrate between a first state in which the reference edge of said light shield member and said light beam are so aligned that said light shield member intercepts said light beam by a predetermined proportion, and a second state in which the periphery of said substrate and said light beam are so aligned that said substrate intercepts a part of said light beam;
    memory means for storing, as a reference signal, a signal based on an output of said light receiving means in said first state; and
    regulation means for regulating the positional relationship between said light beam and said substrate in said second state such that a signal based on an output of said light receiving means in said second state is constantly maintained in a predetermined relationship with said reference signal.

2. An apparatus according to claim 1, further comprising rotation means for rotating said substrate.

3. An apparatus according to claim 1, further comprising light path splitting means positioned between said substrate and said light receiving means in a path of said light beam, with a predetermined angle thereto, and adapted to irradiate the peripheral part of a rear face of said substrate by part of the light beam emitted by said irradiating means and not intercepted by said substrate.

4. An apparatus according to claim 1, wherein said light shield member and said substrate are arranged in a predetermined positional relationship, and said switch means is adapted to move said light beam relative to said light shield member and said substrate for switching between said first and second states.

* * * * *